United States Patent
Cao

(10) Patent No.: US 7,170,963 B2
(45) Date of Patent: Jan. 30, 2007

(54) CLOCK RECOVERY METHOD BY PHASE SELECTION

(75) Inventor: Jiao Meng Cao, Singapore (SG)

(73) Assignee: Nano Silicon Pte. Ltd., Singapore (SG)

( * ) Notice: Subject to any disclaimer, the term of this patent is extended or adjusted under 35 U.S.C. 154(b) by 773 days.

(21) Appl. No.: 10/345,760

(22) Filed: Jan. 15, 2003

(65) Prior Publication Data

US 2004/0136483 A1 Jul. 15, 2004

(51) Int. Cl.
*H03D 3/24* (2006.01)
*H03L 7/00* (2006.01)

(52) U.S. Cl. ............... 375/373; 327/144; 327/152

(58) Field of Classification Search ........ 713/400–401, 713/500–501; 327/291, 293, 294, 298, 150, 327/155, 156–57, 166–67, 231, 238, 243–244, 327/254, 276, 277, 149, 152, 153, 147, 161–163; 331/1 A; 375/373–376, 359; 365/233–233.5
See application file for complete search history.

(56) References Cited

U.S. PATENT DOCUMENTS

| | | | |
|---|---|---|---|
| 5,694,068 A | 12/1997 | Rokugo | 327/159 |
| 5,923,715 A | 7/1999 | Ono | 375/376 |
| 6,157,690 A | 12/2000 | Yoneda | 375/376 |
| 6,384,650 B1 | 5/2002 | Fukunaga et al. | 327/159 |
| 6,389,091 B1 | 5/2002 | Yamaguchi et al. | 375/376 |
| 6,429,707 B1* | 8/2002 | Lamb et al. | 327/159 |
| 6,667,639 B2* | 12/2003 | Oyama | 327/116 |
| 6,807,244 B2* | 10/2004 | Kawasaki et al. | 375/376 |

* cited by examiner

*Primary Examiner*—Mohammed Ghayour
*Assistant Examiner*—Sophia Vlahos
(74) *Attorney, Agent, or Firm*—Saile Ackerman LLC; Stephen B. Ackerman

(57) ABSTRACT

The present invention demonstrates a method and circuit where a plurality of phase clocks from a "frequency lock only" PLL are used to sample an input clock CLKIN. This results in a series of signals from which the phase clock most in synchronization with CLKIN can be determined and presented to the output CLKOUT. If used for data sampling, a phase clock that lags the phase clock most in synchronization may be selected to appear at CLKOUT. This guarantees that sampled data are static during sampling. This system is less complex and consumes minimal power over systems using variable delay circuits.

22 Claims, 4 Drawing Sheets

CLOCK RECOVERY METHOD BY PHASE SELECTION

BACKGROUND OF THE INVENTION

1. Field of the Invention

The invention generally relates to a method used in semiconductor manufacturing and, more particularly, to a phase-locked loop (PLL) method used to synchronize circuit timing in the fabrication of integrated circuits (ICs).

2. Description of Prior Art

Because sequential data may vary in both frequency and phase, phase-locked loops with both frequency and phase locking are typically used to sample that data. The design of these systems is complex and the circuits consume substantial power. One application where this is utilized is in the transfer of data to a display in a portable computer. Here, especially, the excessive power dissipation is undesirable.

Refer now to FIG. 1 showing a typical PLL system for generating an internal synchronization clock (CLKOUT). The reference clock (CLKIN) is applied to the input of a variable delay circuit 10 and the input of a phase comparator 12. The output, CLKOUT, of the variable delay circuit 10 is applied to a second input of the phase comparator 12. The phase comparator 12 output, PCOUT, is an error signal that indicates whether the rising edge of CLKOUT leads or lags CLKIN. PCOUT is then applied to the variable delay circuit 10 to either advance or retard CLKOUT in order to maintain the proper phase relationship. One problem with this circuit is the complexity of the phase comparator and variable delay circuit. The variable delay circuit is typically composed of a plurality of series connected inverter pairs where phase and frequency are changed by adding or removing inverter pairs. Another problem is that the circuit corrects the phase relationship even when the phase difference is small. This results in output jitter and substantial power dissipation during the correction cycle. Finally, this method is poor for applications requiring a wide frequency range and where the frequency of CLKOUT is N times that of CLKIN.

Other approaches related to improving PLL circuits exist. U.S. Pat. No. 6,157,690 to Yoneda teaches a method where a PLL phase correction circuit has three modes of operation. When the phase difference between the input and output clock are within a first minimum range, no phase correction is performed. When the phase difference between the input and output clocks exceed the first minimum range, but fall within a second larger range, a slow correction method that consumes a low level of power is employed. When the phase difference exceeds the second range, a faster method using more power is used. U.S. Pat. No. 5,694,068 to Rokugo teaches a method where the input and output frequencies are each applied to frequency dividers. The frequency dividers generate multiple phases of the divided signal, which are applied to a plurality of quantized phase comparators. The output of the quantized comparators are added and when the sum reaches a certain upper (or lower) limit, a pulse is decremented (or added) to a pulse train which is later divided to create the output frequency. U.S. Pat. No. 5,923,715 to Ono teaches a method where both frequency and phase differences are used to control the PLL signal output. A variable delay circuit with both inverters and capacitors to adjust phase is used. U.S. Pat. No. 6,384,650 B1 to Fukunaga et al. teaches a method using an additional control loop with an adder and differentiator to calculate the frequency difference between the fixed oscillator and PLL output, memory to store that difference, and another circuit to compare the current frequency difference with the previously memorized difference. The result from this additional control loop contributes to the voltage controlled output oscillator frequency. U.S. Pat. No. 6,389,091 B1 to Yamaguchi et al. teaches a method of PLL where the variable controlled oscillator (VCO) frequency is varied by connecting and disconnecting paralleled transistors in a loop containing an odd number of inverters. Using this method, more precise control of the frequency may be made thereby minimizing jitter.

SUMMARY OF THE INVENTION

A principal object of the present invention is to provide a method that produces a PLL clock with a phase nearest to that of an external clock.

Another object of the present invention is to provide a circuit that produces a PLL clock with a phase nearest to that of an external clock.

A further object of the present invention is to provide a method that produces a PLL clock with a phase nearest to that of an external clock while consuming minimal power.

A still further object of the present invention is to provide a circuit that produces a PLL clock with a phase nearest to that of an external clock while consuming minimal power.

Another object of the present invention is to provide a method that identifies a PLL clock with a phase that follows an external clock by a specific interval in order to assure proper data sampling.

A yet further object of the present invention is to provide a circuit that identifies a PLL clock with a phase that follows an external clock by a specific interval in order to assure proper data sampling.

These objects are achieved by using a method and circuit where a plurality of phase clocks are used to sample an input clock CLKIN. This results in a series of signals from which the phase clock most in synchronization with CLKIN can be determined and presented to the output CLKOUT. If used in sampling, a phase clock which lags the phase clock most in synchronization may be selected to appear at CLKOUT. This guarantees that sampled data are static during the sampling interval. This system is less complex than prior art designs and consumes less power over systems using variable delay circuits.

BRIEF DESCRIPTION OF THE DRAWINGS

In the accompanying drawings forming a material part of this description, there is shown.

DESCRIPTION OF THE PREFERRED EMBODIMENTS

Figure 1:
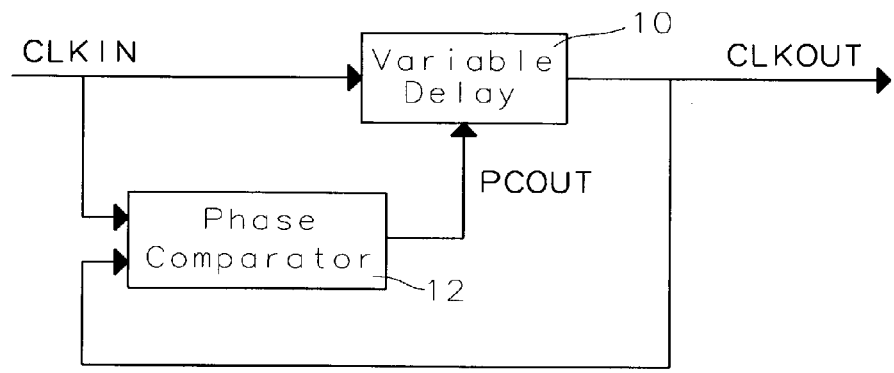
FIG. 1 schematically illustrating a block diagram representation of a typical PLL system.
Figure 2:
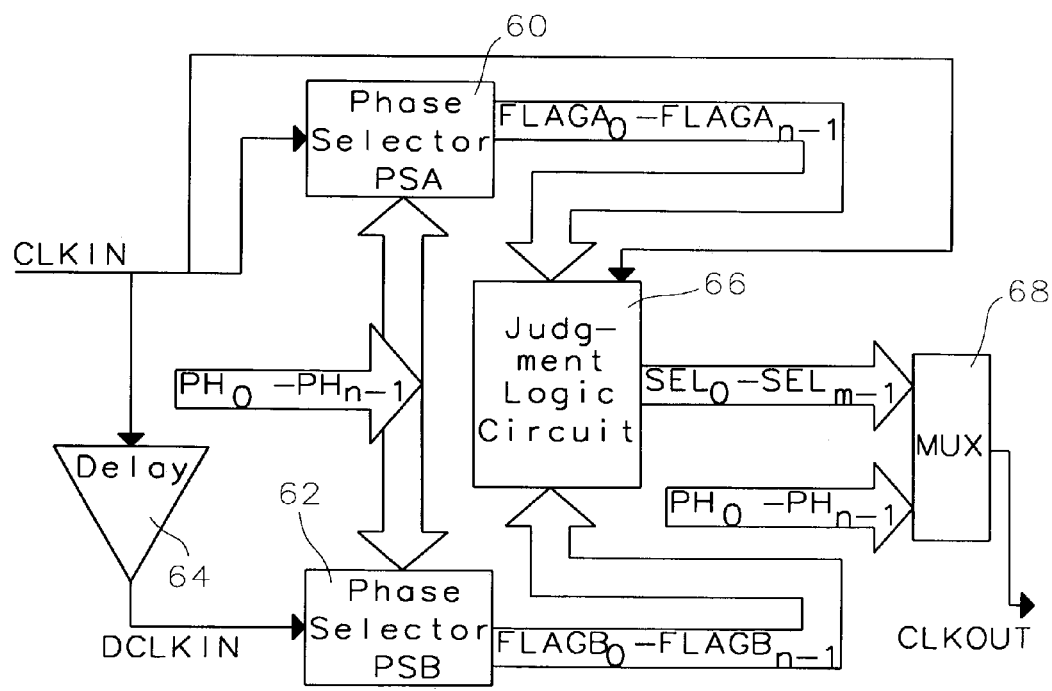
FIG. 2 schematically illustrating a block diagram of the phase synchronizing system of the present invention.

Refer now to FIG. 2, depicting in block diagram the phase selection method of the present invention. Two identical phase selectors, PSA 60 and PSB 62 are provided. A detailed description of the operation of the phase selector (60 and 62) will be discussed later. An external clock, CLKIN is applied to PSA 60 and also to a delay circuit 64. The output of the delay circuit 64 is the applied to PSB 62. Both PSA 60 and PSB 62 have a plurality (n) of phase clocks ($PH_0$ through $PH_{n-1}$) applied. These phase clocks are approximately n times the frequency of CLKIN and are shifted equally by approximately 360°/n ($PH_1$ lags $PH_0$ by 360°/n, $PH_2$ lags $PH_1$ by 360°/n, etc.). PSA has an output bus FLAGA with n bits labeled $FLAGA_0$ through $FLAGA_{n-1}$; similarly, PSB 62 has an output bus FLAGB with n bits labeled $FLAGB_0$ through $FLAGB_{n-1}$. CLKIN, FLAGA and FLAGB are applied to a judgement logic circuit 66. The output of the judgement logic circuit 66 is an m-bit select signal that is applied along with $PH_0$ through $PH_{n-1}$ a multiplexer (MUX) 68. The output of the MUX 68 is the CLKOUT signal.

Figure 3A:
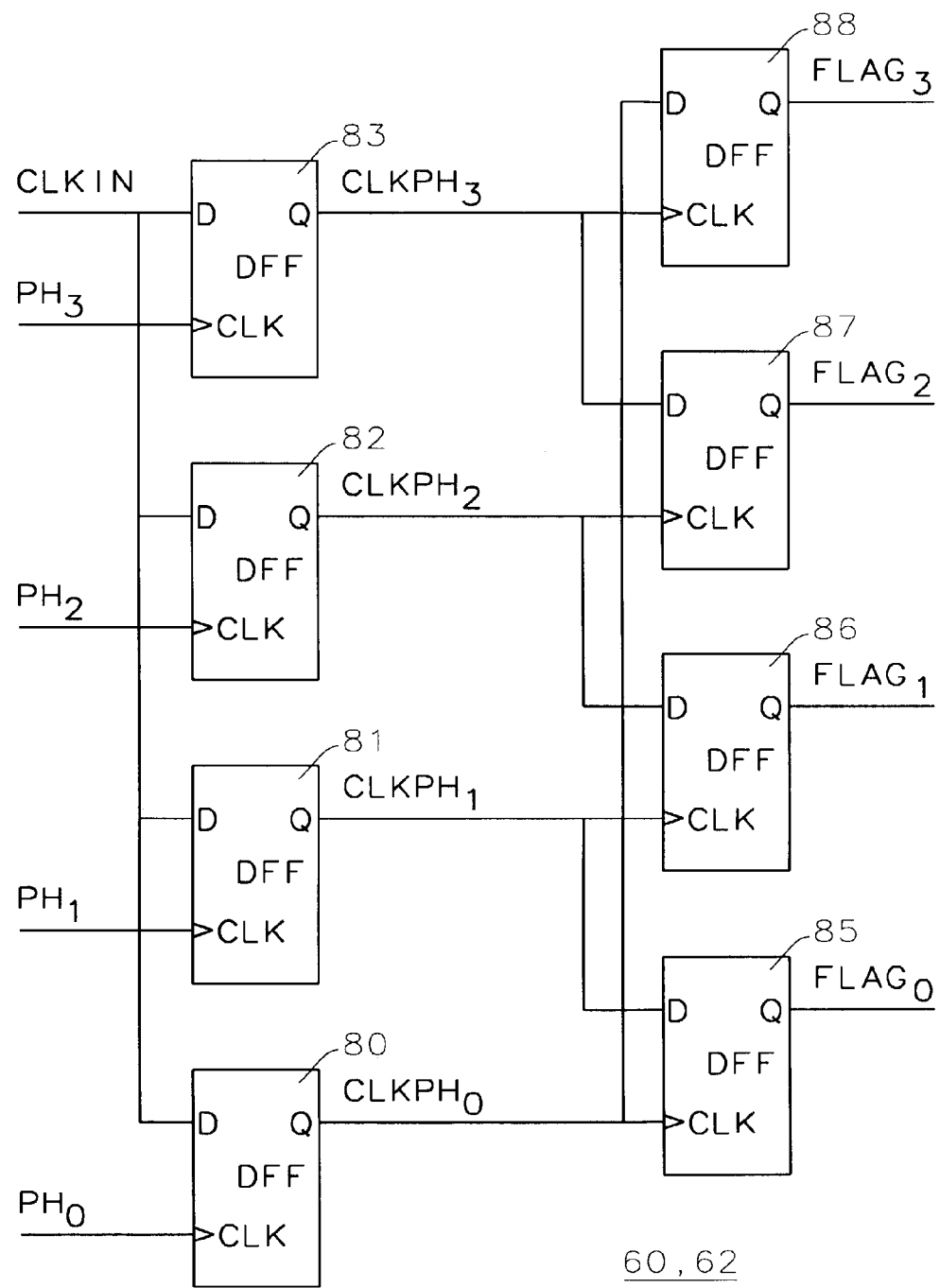
FIGS. 3a and 3b illustrating a schematic representation of a first and second four bit example of the phase selector circuit used in FIG. 2.

Refer to FIG. 3a showing the circuit for each phase selector (60 or 62). For this example, four phase clocks will be used so that phase clock signals $PH_0$ through $PH_3$ will be inputs (n=4). It will be understood by those skilled in the art that more phase clocks and corresponding additional circuitry could be achieved without departing from the spirit and scope of the invention. Four input D flip-flops (DFF) 80–83 are provided all having CLKIN connected to the D inputs and each having $PH_0$, $PH_1$, $PH_2$, and $PH_3$, respectively, connected to the clock input. The outputs of the four DFFs 80–83 are $CLKPH_0$, $CLKPH_1$, $CLKPH_2$, and $CLKPH_3$, respectively. Four (4) output DFFs 85–88 are connected as follows:

$CLKPH_0$ provides the clock input for DFF 85 and the D input for DFF 88,
$CLKPH_1$ provides the clock input for DFF 86 and the D input for DFF 85,
$CLKPH_2$ provides the clock input for DFF 87 and the D input for DFF 86, and
$CLKPH_3$ provides the clock input for DFF 88 and the D input for DFF 87.

The outputs of DFFs 85, 86, 87 and 88 are $FLAG_0$, $FLAG_1$, $FLAG_2$, and $FLAG_3$, respectively. In the broader embodiment where n phase clocks are provided, the first output DFF has its D input connected to the clock of the second output DFF, the second output DFF has its D input connected to the clock of the third output DFF, etc, and the $n^{th}$ output DFF has its D input connected to the clock of the first output DFF.

Figure 3B:
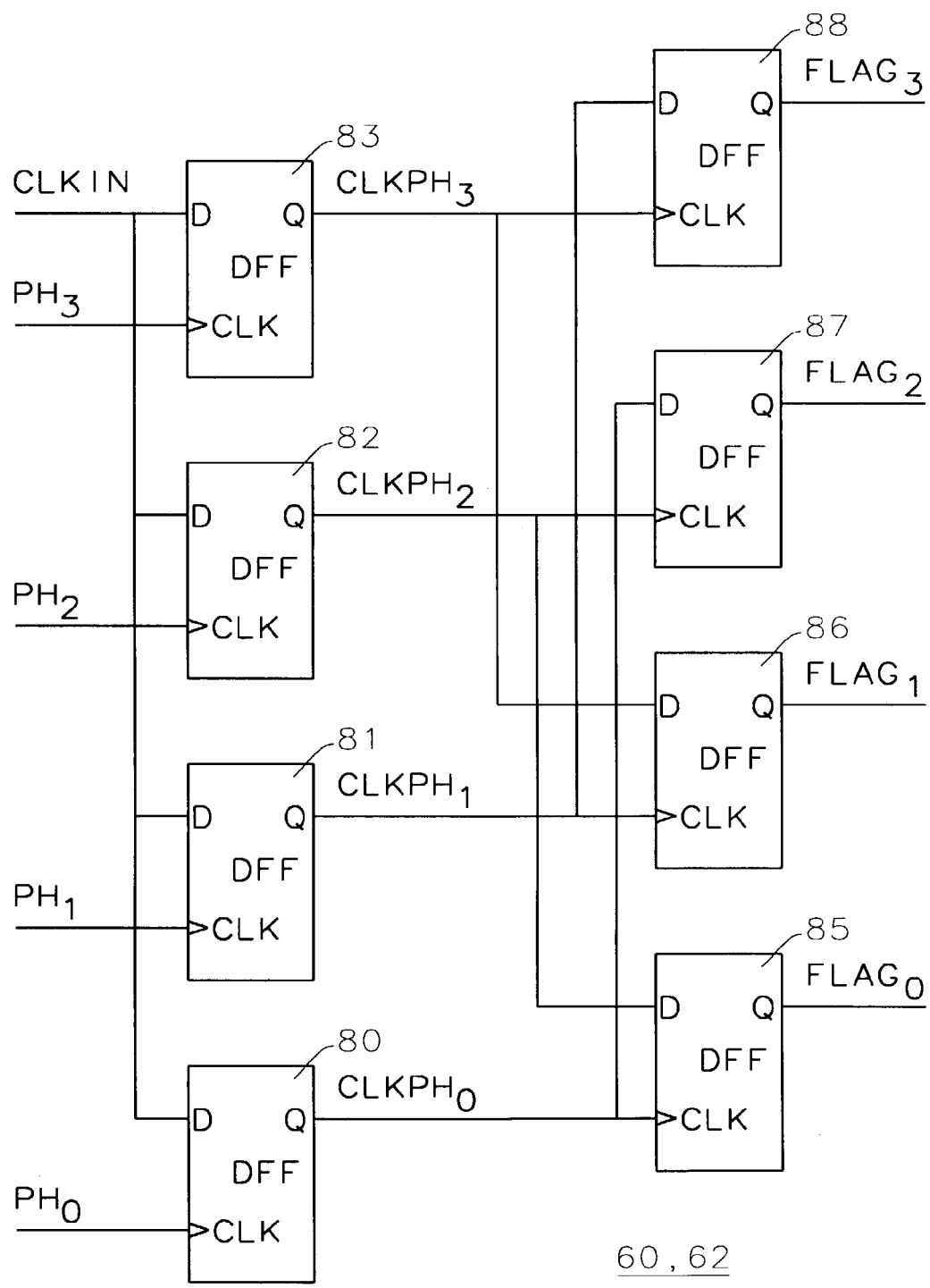

A second embodiment depicted in FIG. 3b would have the four (4) output DFFs 85–88 connected such that:

$CLKPH_0$ provides the clock input for DFF 85 and the D input for DFF 87,
$CLKPH_1$ provides the clock input for DFF 86 and the D input for DFF 88,
$CLKPH_2$ provides the clock input for DFF 87 and the D input for DFF 85, and
$CLKPH_3$ provides the clock input for DFF 88 and the D input for DFF 86.

The outputs of DFFs 85, 86, 87 and 88 are $FLAG_0$, $FLAG_1$, $FLAG_2$, and $FLAG_3$, respectively. In the broader embodiment where n phase clocks are provided, the first output DFF has its D input connected to the clock of the third output DFF, the second output DFF has its D input connected to the clock of the fourth output DFF, etc, the n–$1^{th}$ output DFF has its D input connected to the clock of the first output DFF and the $n^{th}$ output DFF has its D input connected to the clock of the second output DFF.

Figure 4:
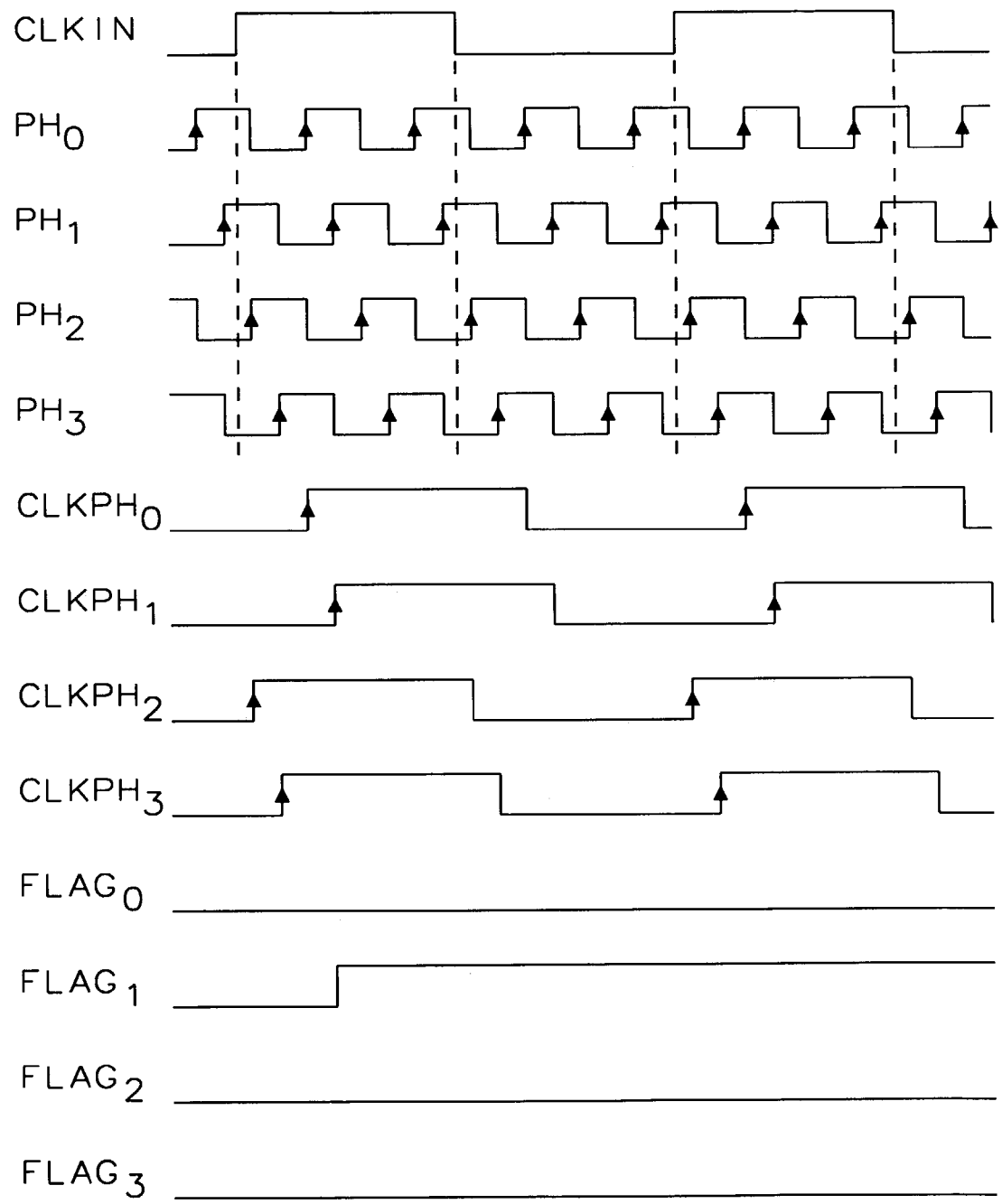
FIG. 4 illustrating the timing diagram of the phase selector circuit of FIGS. 3a and 3b.

Referring to FIGS. 3 and 4, the operation of the phase selector (60 or 62) is now discussed. Since n is four (4) signals $PH_0$ through $PH_3$ will differ in phase by 90° (360°/4) as shown in FIG. 4. Each input DFF 80-83 uses its respective phase clock input (phase clocks $PH_0$, $PH_1$, $PH_2$, and $PH_3$) to store the value of CLKIN at its respective output ($CLKPH_0$, $CLKPH_1$, $CLKPH_2$, and $CLKPH_3$). Storing takes place on the rising edge (for example) of each phase clock, thus, if on the rising edge of $PH_x$, CLKIN is a logic 1 (high), $CLKPH_x$, will become a logic 1. If on the rising edge of PH, CLKIN is a logic 0 (low), $CLKPH_x$, will become a logic 0. As previously described, the output DFFs 85–88 are connected such that CLKPH. provides a D input for one output DFF and the clock input for an adjacent output DFF. On the rising edge of $CLKPH_0$, $FLAG_0$ will assume the logic level on $CLKPH_1$, on the rising edge of $CLKPH_1$, $FLAG_1$, will assume the logic level on $CLKPH_2$, on the rising edge of $CLKPH_2$, $FLAG_2$ will assume the logic level on $CLKPH_3$, and on the rising edge of $CLKPH_3$, $FLAG_3$ will assume the logic level on $CLKPH_0$. As shown in the example timing diagram of FIG. 4, because of the position of CLKIN with respect to the phase clocks ($PH_0$ through $PH_n$) in this example, $CLKPH_2$ leads the other $CLKPH_x$ signals. Additionally, each of the remaining $CLKPH_X$ signals lags behind its previous ($CLKI_{x-1}$) signal. In this example, on the rising edge of $CLKPH_1$, $CLKPH_2$ is high so $FLAG_1$ will become a logic high thereby indicating that $PH_2$ is most in phase with CLKIN. All the remaining $FLAG_X$ signals stay low.

Referring again now to FIG. 2, each phase selector PSA 60 and PSB 62 will generate a FLAG bus (FLAGA and FLAGB) each of which will have a single high level indicating which $PH_X$ is most in phase with either CLKIN (on PSA 60) or the delayed CLKIN (on PSB 62). The judgment logic circuit 66 in conjunction with MUX 68 is used to determine which $PH_X$ to select as CLKOUT. If the system is being used to sample data, and phase clock $PH_X$ is found to be most in phase with CLKIN, a later phase clock such as $PH_{X+2}$ (for example) might be used to guarantee that data is present prior to sampling. By using both PSA 60 and PSB 62, the best $PH_X$ can be chosen to minimize jitter on CLKOUT. In case metastability occurs with PSA 60 (all $FLAG_x$ are '0'), the delay circuit 64 will result in a valid $CLKPH_x$ and $FLAG_X$ pattern on PSB 62. In certain applications, where metastability is not a problem, the PSB 62 and delay 64 circuits may be eliminated.

These objects of the present invention are thus achieved using a method where a phase selector identifies which internally generated phase clock is most in phase with the input clock CLKIN. Once this phase clock is identified, it may be selected using a MUX and presented at the output CLKOUT. The system does not require a feedback loop, or series of inverter pairs to generate the PLL circuitry and is therefore less complex and uses less power. If used in a sampling application, a phase clock which lags behind the in phase clock may be used to assure data presence.

While the invention has been particularly shown and described with reference to the preferred embodiments thereof, it will be understood by those skilled in the art that various changes in form and details may be made without departing from the spirit and scope of the invention.

What is claimed is:

1. A device for selecting from a plurality of phase clocks one of said phase clocks that is nearest in phase to an external clock comprising:
   a first phase selector circuit having said external clock and said plurality of phase clocks as inputs and an equal plurality of first flag signals as outputs;
   a delay circuit having said external clock as an input signal and a delayed external clock as an output signal;
   a second phase selector circuit having said delayed external clock and said plurality of phase clocks as inputs and an equal plurality of second flag signals as outputs;

a judgment logic circuit having as inputs the plurality of said first and second flag signals and said external clock, said judgement logic circuit providing a plurality of select signals as outputs; and a multiplexer having as inputs said plurality of select signals and said plurality of phase clocks, said multiplexer selecting one of said phase clocks.

2. The device according to claim 1 wherein said multiplexer outputs said phase clock nearest in phase to said external clock.

3. The device according to claim 1 wherein said judgment logic circuit uses said first flag signals and said second flag signals to determine which of said plurality of phase clocks is nearest in phase to either said external clock or said delayed external clock.

4. The device according to claim 3 wherein said judgment logic circuit outputs an m-bit binary select signal indicating which of said plurality of phase clocks is nearest in phase to either said external clock or said delayed external clock.

5. The device according to claim 4 wherein said multiplexer outputs said phase clock nearest in phase to said external clock by using said m-bit binary select signal.

6. The device according to claim 4 wherein said multiplexer outputs one of said plurality of phase clocks following said phase clock nearest in phase to said external clock by using said m-bit binary select signal.

7. The device according to claim 1 wherein only one of said plurality of first flag signals has a high logic level thereby indicating which of said plurality of phase clocks is nearest in phase to said external clock or one of said plurality of second flag signals has a high logic level thereby indicating which of said plurality of phase clocks is nearest in phase to said delayed external clock.

8. The device according to claim 1 wherein said first phase selector circuit comprises:

a plurality of first D flip flops all with the D inputs connected to said external clock and having the clock input connected to a distinct one of said plurality of phase clocks such that the first of the plurality of first D flip flops is connected to the first of said plurality of phase clocks, the second of the plurality of first D flip flops is connected to the second of said plurality of phase clocks, etc.; and an equal plurality of second D flip flops wherein the clock input of the first of said plurality of second D flip flops is connected to the output of said first of said plurality of first D flip flops, the clock input of the second of said plurality of second D flip flops is connected to the output of said second of said plurality of first D flip flops, etc., and wherein the D input of said first of said plurality of second D flip flops is connected to said output of said second of said plurality of first D flip flops, the D input of said second of said plurality of second D flip flops is connected to said output of the third of said plurality of first D flip flops, etc. and the D input of the last of said plurality of second D flip flops is connected to said output of said first of said plurality of first D flip flops, and wherein the first of said plurality of first flag signals is generated at the output of said first of said second D flip flops, the second of said plurality of first flag signals is generated at the output of said second of said second D flip flops, etc.

9. The device according to claim 1 wherein said second phase selector circuit comprises:

a plurality of first D flip flops all with the D inputs connected to said delayed external clock and having the clock input connected to a distinct one of said plurality of phase clocks such that the first of the plurality of first D flip flops is connected to the first of said plurality of phase clocks, the second of the plurality of first D flip flops is connected to the second of said plurality of phase clocks, etc.; and an equal plurality of second D flip flops wherein the clock input of the first of said plurality of second D flip flops is connected to the output of said first of said plurality of first D flip flops, the clock input of the second of said plurality of second D flip flops is connected to the output of said second of said plurality of first D flip flops, etc., and wherein the D input of said first of said plurality of second D flip flops is connected to said output of said second of said plurality of first D flip flops, the D input of said second of said plurality of second D flip flops is connected to said output of the third of said plurality of first D flip flops, etc. and the D input of the last of said plurality of second D flip flops is connected to said output of said first of said plurality of first D flip flops, and wherein the first of said plurality of first flag signals is generated at the output of said first of said second D flip flops, the second of said plurality of first flag signals is generated at the output of said second of said second D flip flops, etc.

10. A device for selecting from a plurality of phase clocks one of said phase clocks that is nearest in phase to an external clock comprising:

a first phase selector circuit having said external clock and said plurality of phase clocks as inputs and an equal plurality of first flag signals as outputs;

a delay circuit having said external clock as an input signal and a delayed external clock as an output signal;

a second phase selector circuit, identical to said first phase selector circuit, having said delayed external clock and said plurality of phase clocks as inputs and an equal plurality of second flag signals as outputs;

a judgment logic circuit having as inputs said plurality of first and second flag signals and said external clock, said iudgment logic circuit having an m-bit binary select output signal indicating which of said plurality of phase clocks is nearest in phase to either said external clock or said delayed external clock; and a multiplexer having as input said m-bit binary select signal and said plurality of phase clocks.

11. The device according to claim 10 wherein said multiplexer outputs said phase clock nearest in phase to said external clock.

12. The device according to claim 10 wherein said judgment logic circuit uses said first flag signals and said second flag signals to determine which of said plurality of phase clocks is nearest in phase to either said external clock or said delayed external clock.

13. The device according to claim 10 wherein said multiplexer outputs said phase clock nearest in phase to said external clock by using said m-bit binary select output signal.

14. The device according to claim 10 wherein said multiplexer outputs one of said plurality of phase clocks following said phase clock nearest in phase to said external clock by using said m-bit binary select output signal.

15. The device according to claim 10 wherein only one of said plurality of first flag signals has a high logic level thereby indicating which of said plurality of phase clocks is nearest in phase to said external clock or one of said plurality of second flag signals has a high logic level thereby indicating which of said plurality of phase clocks is nearest in phase to said delayed external clock.

16. The device according to claim 10 wherein said first phase selector circuit comprises:

a plurality of first D flip flops all with the D inputs connected to said external clock and having the clock input connected to a distinct one of said plurality of phase clocks such that the first of the plurality of first D flip flops is connected to the first of said plurality of phase clocks, the second of the plurality of first D flip flops is connected to the second of said plurality of phase clocks, etc.; and an equal plurality of second D flip flops wherein the clock input of the first of said plurality of second D flip flops is connected to the output of said first of said plurality of first D flip flops, the clock input of the second of said plurality of second D flip flops is connected to the output of said second of said plurality of first D flip flops, etc., and wherein the D input of said first of said plurality of second D flip flops is connected to said output of said second of said plurality of first D flip flops, the D input of said second of said plurality of second D flip flops is connected to said output of the third of said plurality of first D flip flops, etc. and the D input of the last of said plurality of second D flip flops is connected to said output of said first of said plurality of first D flip flops, and wherein the first of said plurality of first flag signals is generated at the output of said first of said second D flip flops, the second of said plurality of first flag signals is generated at the output of said second of said second D flip flops, etc.

17. The device according to claim 10 wherein said second phase selector circuit comprises:

a plurality of first D flip flops all with the D inputs connected to said delayed external clock and having the clock input connected to a distinct one of said plurality of phase clocks such that the first of the plurality of first D flip flops is connected to the first of said plurality of phase clocks, the second of the plurality of first D flip flops is connected to the second of said plurality of phase clocks, etc.; and an equal plurality of second D flip flops wherein the clock input of the first of said plurality of second D flip flops is connected to the output of said first of said plurality of first D flip flops, the clock input of the second of said plurality of second D flip flops is connected to the output of said second of said plurality of first D flip flops, etc., and wherein the D input of said first of said plurality of second D flip flops is connected to said output of said second of said plurality of first D flip flops, the D input of said second of said plurality of second D flip flops is connected to said output of the third of said plurality of first D flip flops, etc. and the D input of the last of said plurality of second D flip flops is connected to said output of said first of said plurality of first D flip flops, and wherein the first of said plurality of first flag signals is generated at the output of said first of said second D flip flops, the second of said plurality of first flag signals is generated at the output of said second of said second D flip flops, etc.

18. A method of selecting from a plurality of phase clocks one of said phase clocks that is nearest in phase to an external clock, comprising the steps of:

a) providing a first phase selector circuit having said external clock and said plurality of phase clocks as inputs and an equal plurality of first flag signals as outputs;

b) providing a delay circuit having said external clock as an input signal and a delayed external clock as an output signal;

c) providing a second phase selector circuit having said delayed external clock and said plurality of phase clocks as inputs and an equal plurality of second flag signals as outputs;

d) coupling a judgment logic circuit to the plurality of said first and second flag signals and said external clock, said judgement logic circuit providing a plurality of select signals as outputs; and e) coupling a multiplexer to said plurality of select signals and said plurality of phase clocks, said multiplexer selecting one of said phase clocks.

19. The method according to claim 18 wherein only one of said plurality of first flag signals has a high logic level thereby indicating which of said plurality of phase clocks is nearest in phase to said external clock or one of said plurality of second flag signals has a high logic level thereby indicating which of said plurality of phase clocks is nearest in phase to said delayed external clock.

20. The method according to claim 18 wherein said judgment logic circuit uses said first flag signals and said second flag signals to determine which of said plurality of phase clocks is nearest in phase to either said external clock or said delayed external clock.

21. The method according to claim 18 wherein said judgment logic circuit outputs an m-bit binary select signal indicating which of said plurality of phase clocks is nearest in phase to either said external clock or said delayed external clock.

22. The method according to claim 18 wherein said multiplexer outputs one of said plurality of phase clocks following said phase clock nearest in phase to said external clock by using said m-bit binary select signal.

* * * * *